US012272743B2

(12) United States Patent
Wu et al.

(10) Patent No.: US 12,272,743 B2
(45) Date of Patent: Apr. 8, 2025

(54) SEMICONDUCTOR DEVICE COMPRISING A DRAIN BACK CONTACT ELECTRODE, METHOD OF MANUFACTURING THE SAME, AND SEMICONDUCTOR PACKAGE STRUCTURE

(71) Applicant: GPOWER SEMICONDUCTOR, INC., Jiangsu (CN)

(72) Inventors: Junfeng Wu, Jiangsu (CN); Xingxing Wu, Jiangsu (CN); Yi Pei, Jiangsu (CN)

(73) Assignee: GPOWER SEMICONDUCTOR, INC., Jiangsu (CN)

( * ) Notice: Subject to any disclaimer, the term of this patent is extended or adjusted under 35 U.S.C. 154(b) by 450 days.

(21) Appl. No.: 17/614,972

(22) PCT Filed: Jun. 1, 2020

(86) PCT No.: PCT/CN2020/093724
§ 371 (c)(1),
(2) Date: Nov. 29, 2021

(87) PCT Pub. No.: WO2020/239122
PCT Pub. Date: Dec. 3, 2020

(65) Prior Publication Data
US 2022/0231157 A1 Jul. 21, 2022

(30) Foreign Application Priority Data
May 30, 2019 (CN) .......................... 201910464881.5

(51) Int. Cl.
*H01L 29/778* (2006.01)
*H01L 23/495* (2006.01)
(Continued)

(52) U.S. Cl.
CPC .... *H01L 29/7786* (2013.01); *H01L 23/49506* (2013.01); *H01L 23/4952* (2013.01);
(Continued)

(58) Field of Classification Search
CPC .......... H01L 29/7786; H01L 23/49506; H01L 23/4952; H01L 23/49562; H01L 23/49575;
(Continued)

(56) References Cited

U.S. PATENT DOCUMENTS 9,281,305 B1 * 3/2016 Yang ............... H01L 21/823814
9,343,561 B2 * 5/2016 Radulescu ........ H01L 29/42316
(Continued)

FOREIGN PATENT DOCUMENTS

| CN | 103633046 A | 3/2014 |
|---|---|---|
| CN | 103943677 A | 7/2014 |

(Continued)

*Primary Examiner* — Caleb E Henry
(74) *Attorney, Agent, or Firm* — Armstrong Teasdale LLP

(57) ABSTRACT

The present disclosure discloses a semiconductor device, a method of manufacturing the same, and a semiconductor package structure. The semiconductor device including a substrate, a multilayer semiconductor layer located on one side of the substrate, in which a Two-Dimensional Electron Gas is formed, a first source, a first gate and a first drain located on one side of the multilayer semiconductor layer and located within an active region of the multilayer semiconductor layer, the first gate being located between the first source and the first drain, and a back surface gate contact electrode located on one side of the substrate away from the multilayer semiconductor layer, wherein the first gate is electrically connected to the back surface gate contact electrode. A signal is provided from the back surface of the semiconductor device to the first gate, to reduce the parasitic (Continued)

inductance and parasitic resistance caused by the device during the packaging process.

15 Claims, 5 Drawing Sheets

(51) Int. Cl.
    *H01L 29/20*      (2006.01)
    *H01L 29/40*      (2006.01)
    *H01L 29/417*     (2006.01)
    *H01L 29/423*     (2006.01)
    *H01L 29/66*      (2006.01)

(52) U.S. Cl.
    CPC .. *H01L 23/49562* (2013.01); *H01L 23/49575* (2013.01); *H01L 29/2003* (2013.01); *H01L 29/401* (2013.01); *H01L 29/4175* (2013.01); *H01L 29/42316* (2013.01); *H01L 29/66462* (2013.01)

(58) Field of Classification Search
    CPC ............... H01L 29/2003; H01L 29/401; H01L 29/4175; H01L 29/42316; H01L 29/66462; H01L 23/49531; H01L 2224/0603; H01L 2224/32145; H01L 2224/48137; H01L 2224/48247; H01L 29/778; H01L 29/00
    See application file for complete search history.

(56) References Cited

U.S. PATENT DOCUMENTS

| | | | | |
|---|---|---|---|---|
| 9,985,143 | B2* | 5/2018 | Chen | H01L 29/66219 |
| 10,068,974 | B2* | 9/2018 | Li | H01L 21/31144 |
| 10,103,219 | B2* | 10/2018 | Pei | H01L 29/7786 |
| 10,312,176 | B2* | 6/2019 | Pei | H01L 29/78 |
| 10,381,473 | B2* | 8/2019 | Shibib | H01L 29/205 |
| 10,964,788 | B1* | 3/2021 | Chen | H01L 29/66462 |
| 11,152,474 | B1* | 10/2021 | Chen | H01L 29/41775 |
| 2009/0020764 | A1* | 1/2009 | Anderson | H01L 29/785 257/77 |
| 2009/0072272 | A1* | 3/2009 | Suh | H01L 29/778 257/E21.409 |
| 2010/0055388 | A1* | 3/2010 | Chen | H01L 29/785 216/11 |
| 2010/0270559 | A1* | 10/2010 | Ota | H01L 29/66462 257/E21.445 |
| 2012/0132882 | A1* | 5/2012 | Seo | H10B 63/30 257/E47.001 |
| 2012/0205717 | A1* | 8/2012 | Kurahashi | H01L 29/42316 257/E21.403 |
| 2012/0261643 | A1* | 10/2012 | Cohen | H01L 21/02381 977/734 |
| 2013/0062671 | A1* | 3/2013 | Saito | H01L 29/7783 257/288 |
| 2013/0234207 | A1* | 9/2013 | Choi | H01L 29/778 257/194 |
| 2013/0313524 | A1* | 11/2013 | De Micheli | H01L 29/66439 257/29 |
| 2014/0042390 | A1* | 2/2014 | Gruner | H01G 11/24 257/14 |
| 2015/0043116 | A1* | 2/2015 | Weyers | H03K 17/74 257/272 |
| 2015/0060942 | A1* | 3/2015 | Kume | H01L 29/7813 257/190 |
| 2015/0108499 | A1* | 4/2015 | Alptekin | H01L 21/02609 257/77 |
| 2015/0221884 | A1* | 8/2015 | Han | H10K 10/484 257/29 |
| 2015/0262997 | A1* | 9/2015 | Sato | H01L 29/7786 257/76 |
| 2015/0294921 | A1* | 10/2015 | Viswanathan | H01L 21/28 257/256 |
| 2015/0364591 | A1* | 12/2015 | Lu | H01L 29/66462 257/194 |
| 2015/0364592 | A1* | 12/2015 | van Dal | H10B 12/36 257/29 |
| 2016/0118460 | A1* | 4/2016 | Pei | H01L 29/41758 257/9 |
| 2016/0300792 | A1* | 10/2016 | Kim | H01L 29/0847 |
| 2017/0025339 | A1 | 1/2017 | Liu et al. | |
| 2017/0162654 | A1* | 6/2017 | Maeda | H01L 29/22 |
| 2017/0194473 | A1* | 7/2017 | Sonsky | H01L 29/66462 |
| 2017/0294528 | A1* | 10/2017 | Ren | H01L 29/4175 |
| 2022/0216131 | A1* | 7/2022 | Lee | H01L 23/49833 |

FOREIGN PATENT DOCUMENTS

| | | |
|---|---|---|
| CN | 104347619 A | 2/2015 |
| CN | 205984938 U | 2/2017 |
| CN | 107104142 A | 8/2017 |
| CN | 109004820 A | 12/2018 |
| CN | 109326588 A | 2/2019 |
| JP | 2010165789 A | 7/2010 |
| JP | 2013062298 A | 4/2013 |
| JP | 2016532321 A | 10/2016 |
| JP | 2022525654 A | 5/2022 |

* cited by examiner

SEMICONDUCTOR DEVICE COMPRISING A DRAIN BACK CONTACT ELECTRODE, METHOD OF MANUFACTURING THE SAME, AND SEMICONDUCTOR PACKAGE STRUCTURE

CROSS REFERENCE TO RELATED APPLICATIONS

This patent application is a National Stage Entry of PCT/CN2020/093724 filed on Jun. 1, 2020, which claims the benefit and priority of Chinese Patent Application No. 201910464881.5 filed on May 30, 2019, the disclosures of which are incorporated by reference herein in their entirety as part of the present application.

BACKGROUND

Embodiments of the present disclosure relate to the field of microelectronics technology, and particularly relate to a semiconductor device, a method of manufacturing the same, and a semiconductor package structure.

In terms of semiconductor electronic devices, AlGaN/GaN High Electron Mobility Transistor (HEMT) is a wide bandgap semiconductor device with a high concentration of Two-Dimensional Electron Gas (2DEG), and it has the characteristics of high output power density, high temperature resistance, strong stability and high breakdown voltage, and has great application potential in the field of power electronic devices.

The GaN HEMT device is a horizontal device, and the electrodes thereof are all located on the surface. During the packaging process, the length and layout of the wire interconnection are subject to certain restrictions; while, the parasitic inductance and parasitic resistance caused by the wire interconnection will affect the performance and stability of the GaN HEMT under high-frequency switching.

BRIEF DESCRIPTION

Embodiments of the present disclosure provide a semiconductor device, a method of manufacturing the same, and a semiconductor package structure, to solve the technical problem in the prior art that the performance and stability of the semiconductor device are affected because the electrodes of the semiconductor device are all located on the same surface.

In a first aspect, an embodiment of the present disclosure provides a semiconductor device, including a substrate, a multilayer semiconductor layer located on one side of the substrate, in which a Two-Dimensional Electron Gas is formed, a first source, a first gate and a first drain located on one side of the multilayer semiconductor layer away from the substrate and located within an active region of the multilayer semiconductor layer, the first gate being located between the first source and the first drain, and a back surface gate contact electrode located on one side of the substrate away from the multilayer semiconductor layer, wherein the first gate is electrically connected to the back surface gate contact electrode.

Further, a vertical projection of the back surface gate contact electrode on the substrate covers at least a part of a vertical projection of the first gate on the substrate.

Further, a vertical projection of the back surface gate contact electrode on the substrate covers all of a vertical projection of the first gate on the substrate.

Further, a projection area of the back surface gate contact electrode on the substrate is greater than a sum of vertical projection areas of the first source, the first gate, and the first drain within the active region on the substrate.

Further, the semiconductor device further includes a gate via structure penetrating the substrate and the multilayer semiconductor layer, the first gate being electrically connected to the back surface gate contact electrode through the gate via structure.

Further, the semiconductor device further includes a gate contact electrode, and the first gate extends to a passive region of the multilayer semiconductor layer to form the gate contact electrode, the passive region being arranged around the active region, a vertical projection of the gate contact electrode on the substrate covers a vertical projection of the gate via structure on the substrate, and the first gate is electrically connected to the back surface gate contact electrode through the gate contact electrode and the gate via structure.

Further, the semiconductor device further includes a drain via structure penetrating the substrate and the multilayer semiconductor layer, and a drain back contact electrode located on one side of the substrate away from the multilayer semiconductor layer, and the first drain is electrically connected to the drain back contact electrode through the drain via structure.

Further, the semiconductor device further includes a drain contact electrode, and the first drain extends to a passive region of the multilayer semiconductor layer to form the drain contact electrode, the passive region being arranged around the active region, a vertical projection of the drain contact electrode on the substrate covers a vertical projection of the drain via structure on the substrate, and the first drain is electrically connected to the drain back contact electrode through the drain contact electrode and the drain via structure.

Further, the back surface gate contact electrode and the drain back contact electrode are provided in the same layer and insulated.

In a second aspect, an embodiment of the present disclosure provides a semiconductor package structure, including a semiconductor device according to the first aspect, further including a switching transistor, the switching transistor including a second source, a second gate, and a second drain, the first source being electrically connected to the second drain, the first gate being electrically connected to the second source, the first drain being input with a drain signal, the first gate and the second source being input with a source signal, and the second gate being input with a gate signal, the first source being attached and electrically connected to the second drain, or the semiconductor package structure further including a connection structure, the first gate and the second source being respectively electrically connected to the connection structure, and the back surface gate contact electrode electrically connected to the first gate being attached to a surface of the connection structure.

Further, the semiconductor device includes a gate via structure penetrating the substrate and the multilayer semiconductor layer and a back surface gate contact electrode located on one side of the substrate away from the multilayer semiconductor layer, and the first gate is electrically connected to the back surface gate contact electrode through the gate via structure. The connection structure includes a frame and a source signal input terminal located on a first surface of the frame, the back surface gate contact electrode is attached and electrically connected to the source signal input terminal, and the second source is electrically connected to the source signal input terminal by wire bonding.

Further, the semiconductor package structure further includes a gate signal input terminal, a drain signal input terminal, and a supporting sheet, the supporting sheet includes a second surface and a third surface that are oppositely arranged and insulated from each other, the third surface being attached to the first surface, and the second surface being provided with a surface connection layer, the second source and the second drain are located on opposite surfaces of the switching transistor, the first source is electrically connected to the surface connection layer by wire bonding, and the second drain is attached to the surface connection layer, the first drain is electrically connected to the drain signal input terminal by wire bonding, and the second gate is electrically connected to the gate signal input terminal by wire bonding.

Further, the semiconductor device includes a gate via structure and a drain via structure penetrating the substrate and the multilayer semiconductor layer, and a back surface gate contact electrode and a drain back contact electrode located on one side of the substrate away from the multilayer semiconductor layer, the first gate is electrically connected to the back surface gate contact electrode through the gate via structure, and the first drain is electrically connected to the drain back contact electrode through the drain via structure, the second source and the second drain are located on opposite surfaces of the switching transistor, and the first source is attached and electrically connected to the second drain.

Further, the semiconductor package structure further includes a source signal input terminal, a gate signal input terminal, and a drain signal input terminal, the first gate is electrically connected to the source signal input terminal by wire bonding, and the second source is electrically connected to the source signal input terminal by wire bonding, the first drain is electrically connected to the drain signal input terminal by wire bonding, and the second gate is electrically connected to the gate signal input terminal by wire bonding.

In a third aspect, an embodiment of the present disclosure provides a method of manufacturing a semiconductor device according to the first aspect, including providing a substrate, forming a multilayer semiconductor layer on one side of the substrate, in which a two-dimensional electron gas is formed, forming a first source, a first gate and a first drain on one side of the multilayer semiconductor layer away from the substrate and within an active region of the multilayer semiconductor layer, the first gate being located between the first source and the first drain, and forming a back surface gate contact electrode on one side of the substrate away from the multilayer semiconductor layer, the first gate being electrically connected to the back surface gate contact electrode.

Further, the method of manufacturing further includes forming a gate via structure penetrating the substrate and the multilayer semiconductor layer, the first gate being electrically connected to the back surface gate contact electrode through the gate via structure.

Further, the method of manufacturing further includes forming a drain back contact electrode on one side of the substrate away from the multilayer semiconductor layer, the first drain being electrically connected to the drain back contact electrode.

Further, the method of manufacturing further includes forming a drain via structure penetrating the substrate and the multilayer semiconductor layer, the first drain being electrically connected to the drain back contact electrode through the drain via structure.

Embodiments of the present disclosure provide a semiconductor device, a method of manufacturing the same, and a semiconductor package structure. The semiconductor device includes the back surface gate contact electrode electrically connected to the first gate, and the first gate is electrically connected to the back surface gate contact electrode, so that a signal can be directly loaded to the back surface gate contact electrode and transmitted to the first gate through the back surface gate contact electrode, to ensure that signals can be loaded to the first source, the first gate, and the first drain of the semiconductor device from different surfaces, reduce the interconnection wires used in the semiconductor packaging process, reduce the parasitic inductance and parasitic resistance caused by the wire interconnection, and improve the performance and stability of the semiconductor device under high-frequency switching. Meanwhile, the restriction of the wire layout due to loading signals to the first source, the first gate and the first drain from the same surface can also be avoided during the packaging process of the semiconductor device, thereby improving the packaging flexibility of the semiconductor device. This may not only greatly increase the dynamic resistance of the device, but also take into account the heat dissipation around the working center of the device at the same time and improve the reliability and service life of the semiconductor device.

BRIEF DESCRIPTION OF THE DRAWINGS

Other features and advantages of the present disclosure will become more apparent through reading the detailed description of non-limiting embodiments with reference to the following drawings.

DETAILED DESCRIPTION

In order to make the technical solutions and advantages of the present disclosure clearer, the technical solutions of the present disclosure will be fully described below through specific implementations in conjunction with the accompanying drawings in the embodiments of the present disclosure. Obviously, the embodiments to be described refer to a part of the embodiments of the present disclosure, other than all of the embodiments. On the basis of the embodiments of the present disclosure, all other embodiments those of ordinary skill in the art obtain requiring no inventive effort belong to the scope protected by the present disclosure.

Figure 1:
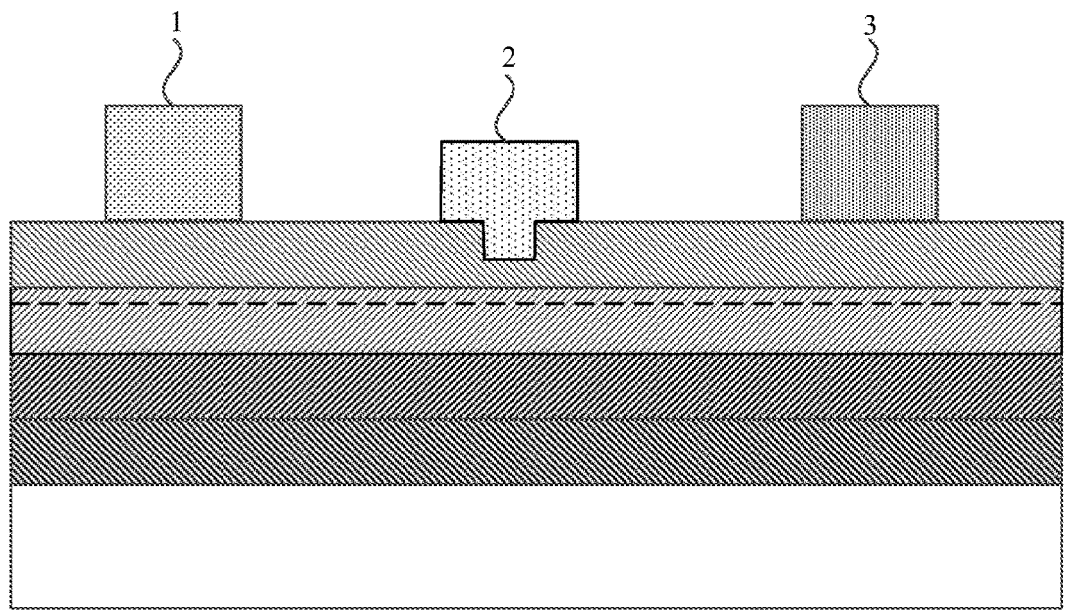
FIG. 1 is a schematic cross-sectional structure diagram of a semiconductor device in the prior art.

FIG. 1 is a schematic cross-sectional structure diagram of a semiconductor device in the prior art. As shown in FIG. 1, in the prior art, a source 1, a gate 2, and a drain 3 are located on the same surface of the semiconductor device. Signals will be loaded to the source 1, the gate 2, and the drain 3 of the semiconductor device from the same surface, which leads to more interconnect wires, and the parasitic inductance and parasitic resistance caused by the wire interconnection are relatively high, which affects the performance and stability of the semiconductor device under high-frequency switching. Meanwhile, signals will be loaded to the source 1, the gate 2, and the drain 3 of the semiconductor device from the same surface, which causes the wire layout to be limited, and the packaging flexibility of the semiconductor device needs to be improved.

Based on the foregoing problem, an embodiment of the present disclosure provides a semiconductor device including a substrate, a multilayer semiconductor layer located on one side of the substrate, in which a Two-Dimensional Electron Gas is formed, a first source, a first gate and a first drain located on one side of the multilayer semiconductor layer away from the substrate and located within an active region of the multilayer semiconductor layer, the first gate being located between the first source and the first drain, and a back surface gate contact electrode located on one side of the substrate away from the multilayer semiconductor layer, wherein the first gate is electrically connected to the back surface gate contact electrode. Using the technical solution above, in which the semiconductor device includes the back surface gate contact electrode electrically connected to the first gate, the first gate can directly load a signal to the back surface gate contact electrode and the signal is transmitted to the first gate through the back surface gate contact electrode, to ensure that signals can be loaded to the first source, the first gate, and the first drain of the semiconductor device from different surfaces, reduce the interconnection wires used in the semiconductor packaging process, reduce the parasitic inductance and parasitic resistance caused by the wire interconnection, and improve the performance and stability of the semiconductor device under high-frequency switching. Meanwhile, the restriction of the wire layout due to loading signals to the first source, the first gate and the first drain from the same surface can also be avoided during the packaging process of the semiconductor device, thereby improving the packaging flexibility of the semiconductor device. This may not only greatly increase the dynamic resistance of the device, but also take into account the heat dissipation around the working center of the device at the same time and improve the reliability and service life of the semiconductor device.

The above is the core concept of the present disclosure, and the technical solutions in the embodiments of the present disclosure will be described clearly and completely in conjunction with the accompanying drawings in the embodiments of the present disclosure. On the basis of the embodiments of the present disclosure, all other embodiments those of ordinary skill in the art obtain requiring no inventive effort belong to the scope protected by the present disclosure.

Figure 2:
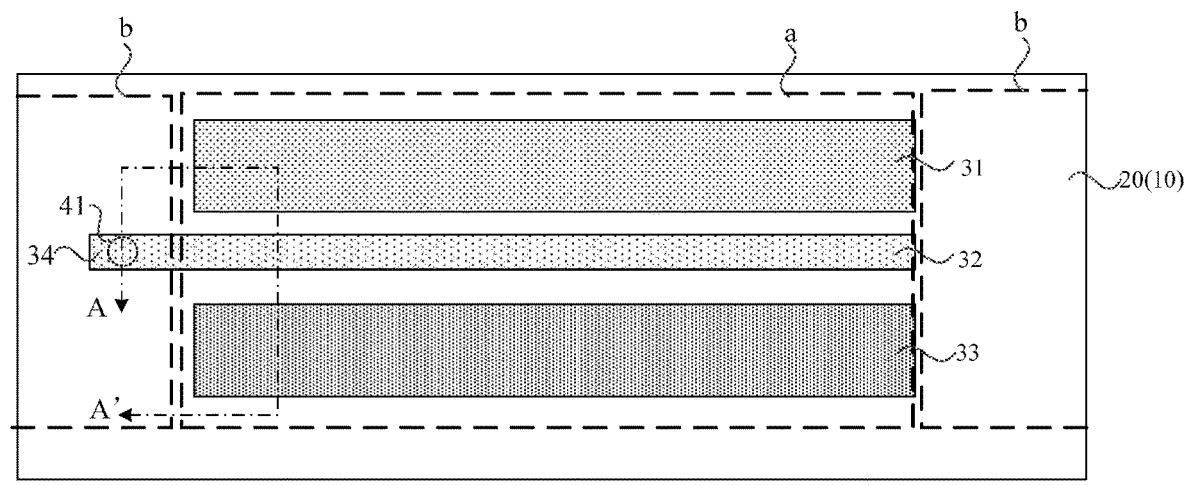
FIG. 2 is a schematic top view of the structure of a semiconductor device according to an embodiment of the present disclosure.
Figure 3:
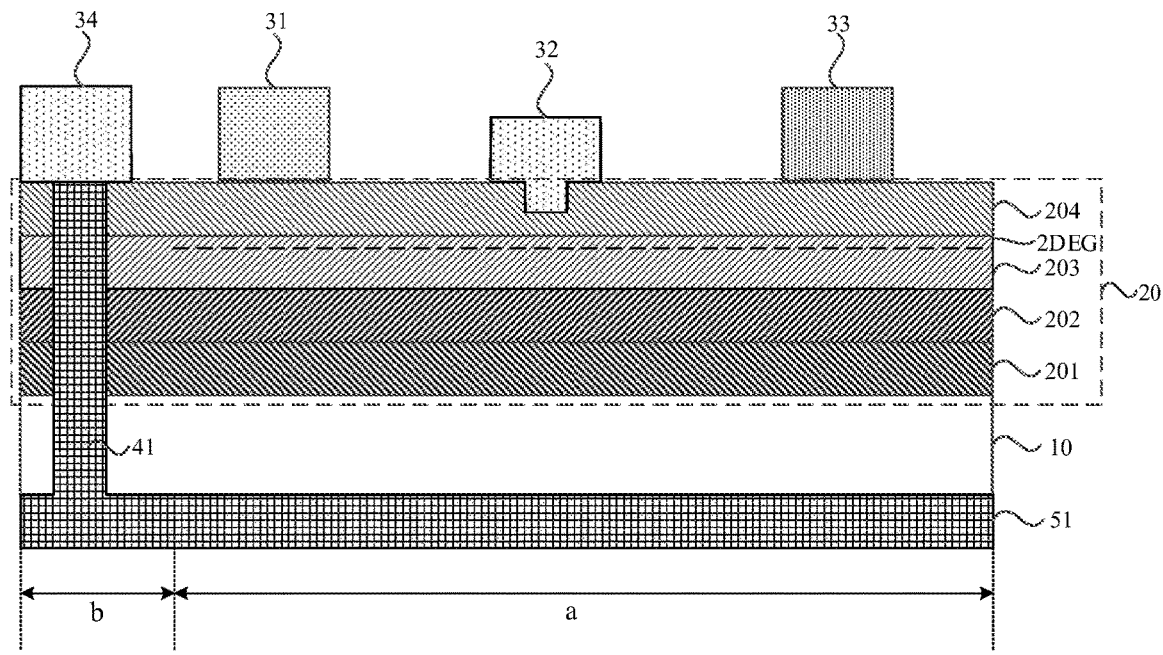
FIG. 3 is a schematic cross-sectional structure diagram of the semiconductor device provided in FIG. 2 along a section line A-A'.

FIG. 2 is a schematic top view of the structure of a semiconductor device according to an embodiment of the present disclosure, and FIG. 3 is a schematic cross-sectional structure diagram of the semiconductor device provided in FIG. 2 along a section line A-A'. As shown in FIG. 2 and FIG. 3, the semiconductor device provided by the embodiment of the present disclosure may include a substrate 10, a multilayer semiconductor layer 20 located on one side of the substrate 10, in which a Two-Dimensional Electron Gas 2DEG is formed, a first source 31, a first gate 32, and a first drain 33 located on one side of the multilayer semiconductor layer 20 away from the substrate 10 and located within an active region a of the multilayer semiconductor layer 20, the first gate 32 being located between the first source 31 and the first drain 33, and a back surface gate contact electrode 51 located on one side of the substrate 10 away from the multilayer semiconductor layer 20, wherein the back surface gate contact electrode 51 is electrically connected to the first gate 32, to achieve the same potential of the back surface gate contact electrode 51 and the first gate 32.

A vertical projection of the back surface gate contact electrode 51 on the substrate 10 covers at least a part of a vertical projection of the first gate 32 on the substrate 10, thereby improving the dynamic resistance while taking into account the heat dissipation near the gate. A vertical projection of the back surface gate contact electrode 51 on the substrate 10 covers all of a vertical projection of the first gate 32 on the substrate 10, so that the heat dissipation near the gate can be further improved. Furthermore, the projection area of the back surface gate contact electrode 51 on the substrate 10 is greater than the sum of vertical projection areas of the first source 31, the first gate 32, and the first drain 33 within the active region on the substrate 10, thereby improving the heat dissipation around the working center of the semiconductor device.

More specifically, the semiconductor device structure provided by the present disclosure may not only greatly increase the dynamic resistance of the device, but also take into account the heat dissipation around the working center of the device at the same time and improve the reliability and service life of the semiconductor device, especially suitable for the Cascode structure of power electronic applications.

The semiconductor device may include a gate via structure 41 penetrating the substrate 10 and the multilayer semiconductor layer 20, the first gate 32 is electrically connected to the back surface gate contact electrode 51 through the gate via structure 41, to achieve the same potential of the first gate 32 and the back surface gate contact electrode 51.

Exemplarily, the material of the substrate 10 may be one or a combination of sapphire, silicon carbide, silicon, gallium arsenide, gallium nitride, or aluminum nitride, or other materials suitable for growing gallium nitride, and the embodiment of the present disclosure does not limit this. The multilayer semiconductor layer 20 is located on one side of the substrate 10, and the multilayer semiconductor layer 20 may specifically be a III-V compound semiconductor material.

The source 31, the gate 32, and the drain 33 are located on one side of the multilayer semiconductor layer 20 away from the substrate 10, and the gate 32 is located between the source 31 and the drain 33, as shown in FIGS. 2 and 3. The source 31 and the drain 33 may form an ohmic contact with the multilayer semiconductor layer 20, and the gate 32 forms a Schottky contact with the multilayer semiconductor layer 20. The material of the source 31 and the drain 33 may be one or a combination of metals such as Ni, Ti, Al, Au, etc., and the material of the gate 32 may be one or a combination of metals such as Ni, Pt, Pb, Au, etc. The gate 32 may be a single-layer metal gate, or a double-layer metal stacked or multi-layer gate structure. The shape of the gate 32 may be rectangular (not shown in the drawing) or T-shaped, as shown in FIG. 3, to ensure that the gate 32 is in good Schottky contact with the multilayer semiconductor layer 20.

The back surface gate contact electrode 51 is a conductive metal layer, and the material thereof may be one or a combination of metals such as Ni, Ti, Al, Au, Pt, Pb, Ag etc., and the back surface gate contact electrode 51 may be a multilayer metal layer. The back surface gate contact electrode 51 may be a thin conductive metal layer, the thickness of which is smaller than the thickness of the gate 32.

The gate via structure 41 penetrates the substrate 10 and the multilayer semiconductor layer 20, the back surface gate contact electrode 51 is located on one side of the substrate 10 away from the multilayer semiconductor layer 20, and the first gate 32 is electrically connected to the back surface gate contact electrode 51 through the gate via structure 41, so that a signal may be loaded from the back surface of the semiconductor device to the back surface gate contact electrode 51, and then transmitted to the first gate 32 through the gate via structure 41, to ensure that signals may be loaded to the first source 31, the first gate 32 and the first drain 33 of the semiconductor device from different surfaces. For instance, the back surface gate contact electrode 51 covers the surface of the entire substrate 10, signals may be loaded to the first source 31 and the first drain 33 from the front surface of the semiconductor device, and a signal may be loaded to the first gate 32 from the back surface of the semiconductor device. Specifically, the first source 31 and the first drain 33 may be bonded to the signal input terminal through interconnection wires, and the first gate 32 may be directly attached and electrically connected to the signal input terminal, to reduce the interconnection wires used in the semiconductor packaging process, reduce the parasitic inductance and parasitic resistance caused by the wire interconnection, and improve the performance and stability of the semiconductor device under high-frequency switching. Meanwhile, it can also avoid the restriction of the wire layout due to loading signals to the first source 31, the first gate 32, and the first drain 33 from the same surface during the packaging process of the semiconductor device, thereby improving the packaging flexibility of the semiconductor device.

It should be noted that the front surface of the semiconductor device may be understood as one side surface on which the first source 31, the first gate 32, and the first drain 33 are formed, and the back surface of the semiconductor device may be understood as one side surface on which the back surface gate contact electrode 51 is formed.

Referring to FIG. 3, the multilayer semiconductor layer 20 provided by the embodiment of the present disclosure may include a nucleation layer 201 located on the substrate 10, a buffer layer 202 located on one side of the nucleation layer 201 away from the substrate 10, a channel layer 203 located on one side of the buffer layer 202 away from the nucleation layer 201, a barrier layer 204 located on one side of the channel layer 203 away from the buffer layer 202, the barrier layer 204 and the channel layer 203 forming a heterojunction structure, and forming a Two-Dimensional Electron Gas at the interface of the heterojunction.

Exemplarily, the material of the nucleation layer 201 and the buffer layer 202 may be nitride, and specifically may be GaN or AlN or other nitrides, and the nucleation layer 201 and the buffer layer 202 may be used to match the material of the substrate 10 and the epitaxial channel layer 203. The material of the channel layer 203 may be GaN or other semiconductor materials, such as InAlN. The barrier layer 204 is located above the channel layer 203, and the material of the barrier layer 204 may be any semiconductor material that can form a heterojunction structure with the channel layer 203, including gallium-based compound semiconductor materials or nitride-based semiconductor materials, for instance, InxAlyGazN1-x-y-z, where 0≤x≤1, 0≤y≤1, 0≤z≤1. When the barrier layer 204 is an aluminum gallium nitride layer, the aluminum content of the aluminum gallium nitride layer is generally between 20% and 30%, and the thickness of the aluminum gallium nitride layer is generally between 10 and 50 nm. The channel layer 203 and the barrier layer 204 may form a semiconductor heterojunction structure, and a high-concentration 2DEG is formed at the interface of the channel layer 203 and the barrier layer 204.

Referring to FIG. 2 and FIG. 3, the semiconductor device provided by the embodiment of the present disclosure may further include a gate contact electrode 34, and the first gate 32 extends to the passive region b of the multilayer semiconductor layer 20 to form the gate contact electrode 34, wherein the passive region b may be arranged around the active region a. The vertical projection of the gate contact electrode 34 on the substrate 10 covers the vertical projection of the gate via structure 41 on the substrate 10, the first gate 32 may be electrically connected to the back surface gate contact electrode 51 through the gate contact electrode 34 and the gate via structure 41. The back surface gate contact electrode 51 covers the active region a and the passive region b at the same time, so that the active region a and the passive region b on the back surface of the semiconductor device are both at the same potential as the first gate 32.

Exemplarily, the first gate 32 extends to the passive region b to form the gate contact electrode 34, and the gate contact electrode 34 is electrically connected to the back surface gate contact electrode 51 through the gate via structure 41, wherein the active region a may be understood as the working region of the semiconductor device, in which there are a large number of 2DEG, electrons or holes, etc.; the passive region b may be understood as the non-working region of the semiconductor device, in which there is no Two-Dimensional Electron Gas, electrons or holes, for instance, through a mesa etch process (MESA etch), an ion implantation process, or an oxidation isolation process, the Two-Dimensional Electron Gas, electrons, or holes underneath are eliminated or isolated. The first gate 32 is arranged to extend to the passive region b to form the gate contact electrode 34, and the gate contact electrode 34 is electrically connected to the back surface gate contact electrode 51 through the gate via structure 41, without the first gate 32 being directly punched down in the active region a to be electrically connected to the back surface gate contact electrode 51, to ensure that the semiconductor device may work normally in the active region a, and at the same time, it is possible to realize the electrical connection between the first gate 32 and the back surface gate contact electrode 51 to receive signals normally.

Figure 4:
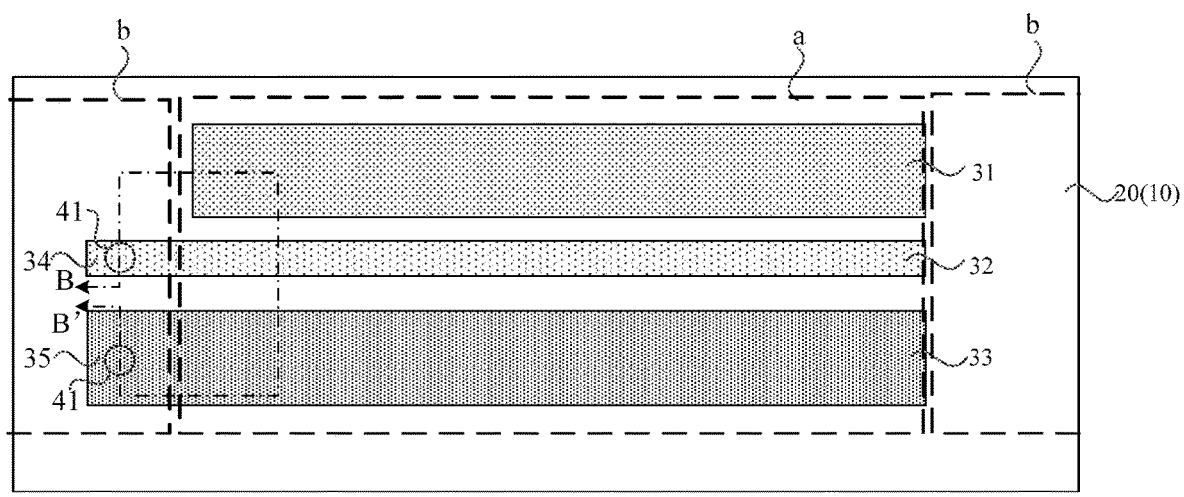
FIG. 4 is a schematic top view of the structure of another semiconductor device according to an embodiment of the present disclosure.
Figure 5:
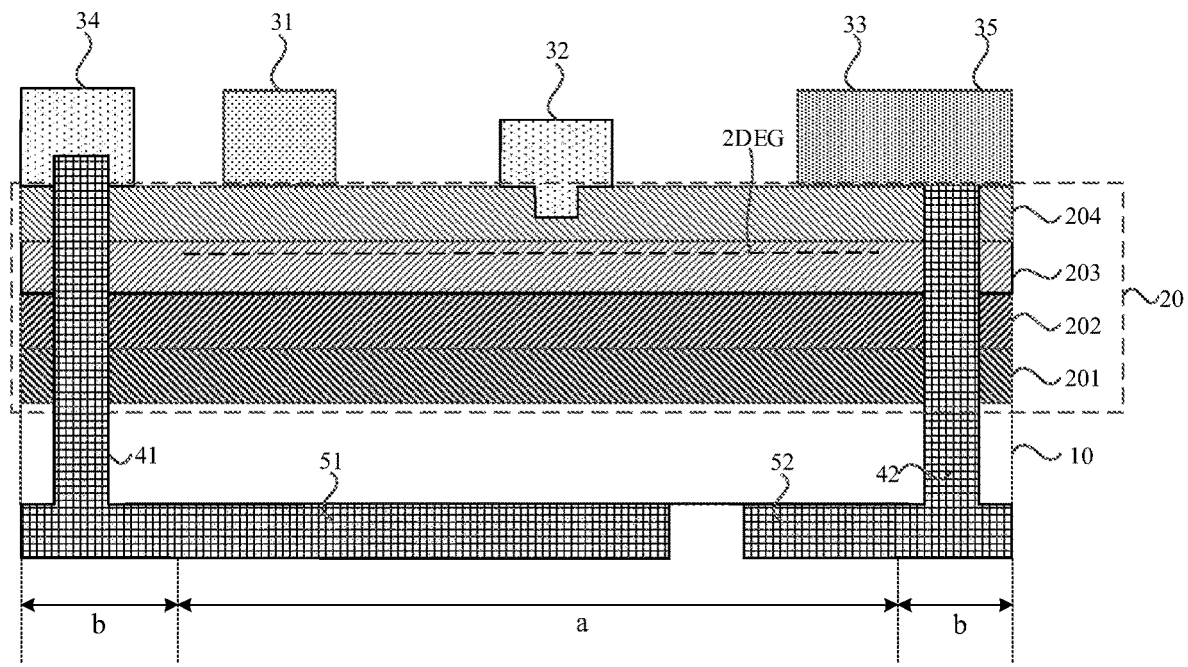
FIG. 5 is a schematic cross-sectional structure diagram of the semiconductor device provided in FIG. 4 along a section line B-B'.

FIG. 4 is a schematic top view of the structure of another semiconductor device according to an embodiment of the present disclosure, and FIG. 5 is a schematic cross-sectional structure diagram of the semiconductor device provided in FIG. 4 along a section line B-B'; as shown in FIG. 4 and FIG. 5, the semiconductor device provided by the embodiment of the present disclosure may further include a drain via structure 42 penetrating the substrate 10 and the multilayer semiconductor layer 20, and a drain back contact electrode 52 located on one side of the substrate 10 away from the multilayer semiconductor layer 20; the first drain 33 is electrically connected to the drain back contact electrode 52 through the drain via structure 42.

Exemplarily, the gate via structure 41 and the drain via structure 42 respectively penetrate the substrate 10 and the multilayer semiconductor layer 20, the back surface gate contact electrode 51 and the drain back contact electrode 52 are respectively located on one side of the substrate 10 away from the multilayer semiconductor layer 20, the first gate 32 is electrically connected to the back surface gate contact electrode 51 through the gate via structure 41, and the first drain 33 is electrically connected to the drain back contact electrode 52 through the drain via structure 42. In this way, signals may be loaded from the back surface of the semiconductor device to the back surface gate contact electrode 51 and the drain back contact electrode 52, respectively, and then transmitted to the first gate 32 and the first drain 33 through the gate via structure 41 and the drain via structure 42, respectively, to ensure that signals may be loaded to the first source 31, the first gate 32, and the first drain 33 of the semiconductor device from different surfaces. For instance, a signal may be loaded to the first source 31 from the front surface of the semiconductor device, and signals may be loaded to the first gate 32 and the first drain 33 from the back surface of the semiconductor device, specifically, it may be that the first source 31 may be directly attached and electrically connected to other electrodes, and the first gate 32 and the first drain 33 are bonded to the signal input terminal through interconnection wires, to reduce the interconnection wires used in the semiconductor packaging process, reduce the parasitic inductance and parasitic resistance caused by the wire interconnection, and improve the performance and stability of the semiconductor device under high-frequency switching; meanwhile, it can also avoid the restriction of the wire layout due to loading signals to the first source 31, the first gate 32, and the first drain 33 from the same surface during the packaging process of the semiconductor device, thereby improving the packaging flexibility of the semiconductor device.

Referring to FIGS. 4 and 5, the semiconductor device provided by the embodiment of the present disclosure may further include a drain contact electrode 35, and the first drain 33 extends to the passive region b of the multilayer semiconductor layer 20 to form the drain contact electrode 35, wherein the passive region b is arranged around the active region a. The vertical projection of the drain contact electrode 35 on the substrate 10 covers the vertical projection of the drain via structure 42 on the substrate 10, the first drain 33 is electrically connected to the drain back contact electrode 52 through the drain contact electrode 35 and the drain via structure 42.

Exemplarily, the first gate 32 extends to the passive region b to form the gate contact electrode 34, and the gate contact electrode 34 may be electrically connected to the back surface gate contact electrode 51 through the gate via structure 41, the first drain 33 extends to the passive region b of the multilayer semiconductor layer 20 to form the drain contact electrode 35, and the drain contact electrode 35 is electrically connected to the drain back contact electrode 52 through the drain via structure 42, without the first gate 32 and the first drain 33 being directly punched down in the active region a respectively, to be electrically connected to the back surface gate contact electrode 51 and the drain back contact electrode 52 respectively, to ensure that the semiconductor device may work normally in the active region a, and at the same time, it is possible to realize the electrical connection between the first gate 32 and the back surface gate contact electrode 51 to receive signals normally, and the first drain 33 is electrically connected to the drain back contact electrode 52 to receive a drain signal normally.

Referring to FIG. 4 and FIG. 5, the back surface gate contact electrode 51 and the drain back contact electrode 52 are provided in the same layer and insulated.

Exemplarily, the back surface gate contact electrode 51 and the drain back contact electrode 52 are insulated to ensure that signals are independently loaded to the first gate 32 and the first drain 33, respectively, to avoid signal crosstalk from causing the semiconductor device to fail to work normally. For instance, an opening is provided between the back surface gate contact electrode 51 and the drain back contact electrode 52, so that the two contact electrodes are separated, an insulating medium may also be filled in the opening between the back surface gate contact electrode 51 and the drain back contact electrode 52. At the same time, the back surface gate contact electrode 51 and the drain back contact electrode 52 are arranged in the same layer to ensure that the film layer of the semiconductor device is simply arranged, which is beneficial to realize the thin design of the semiconductor device.

Figure 6:
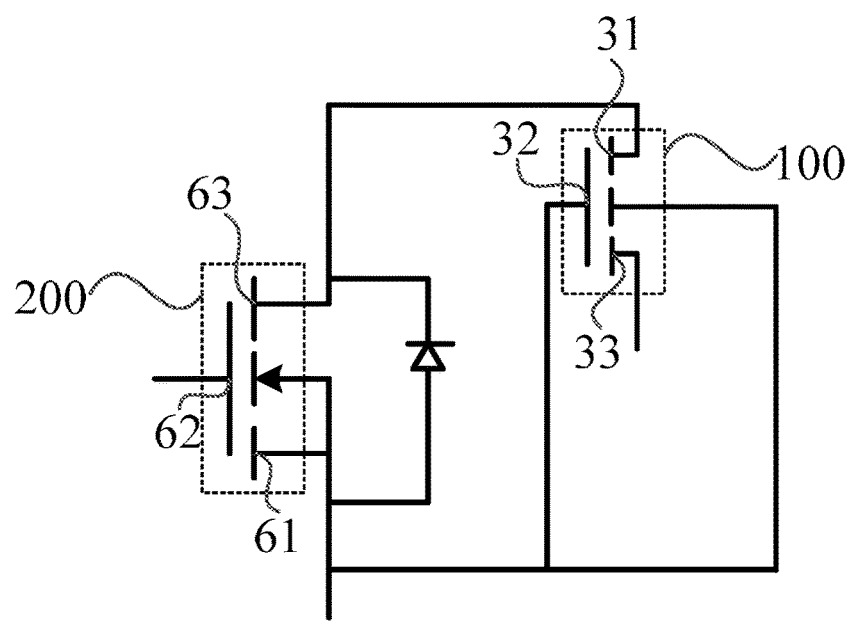
FIG. 6 is a schematic circuit diagram of a semiconductor package structure using a Cascode structure provided by an embodiment of the present disclosure.
Figure 7:
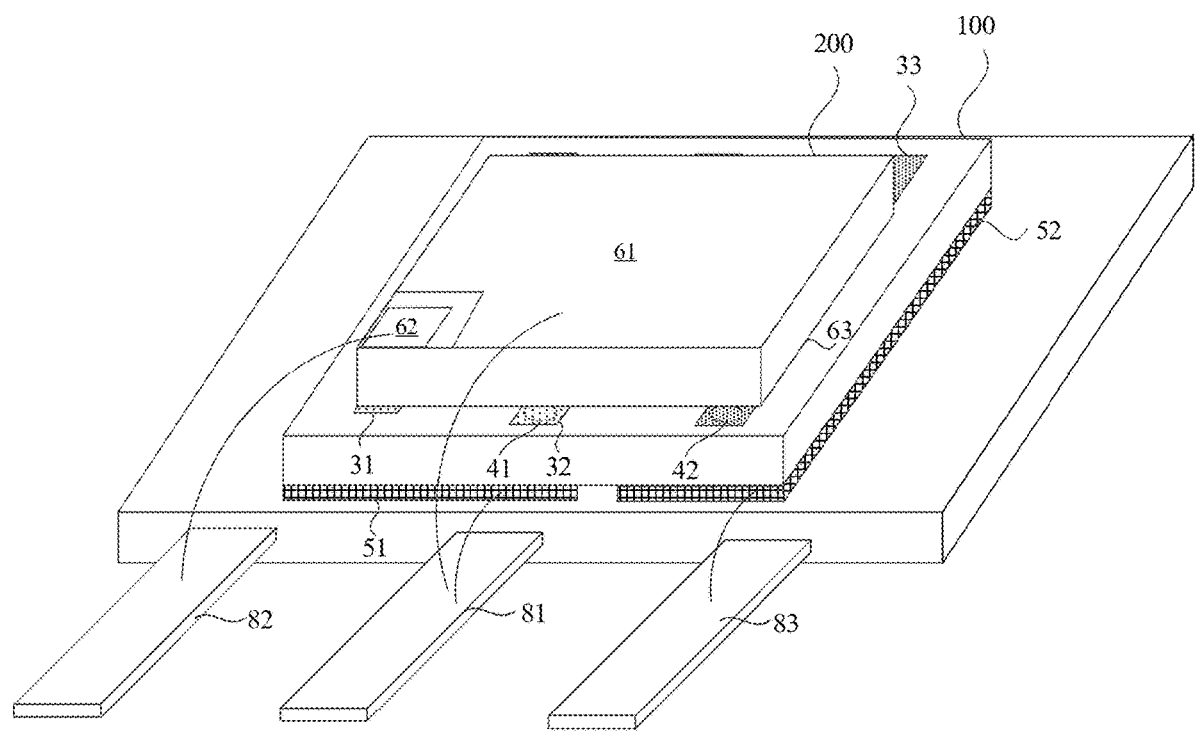
FIG. 7 is a schematic structural diagram of a semiconductor package structure provided by an embodiment of the present disclosure.
Figure 8:
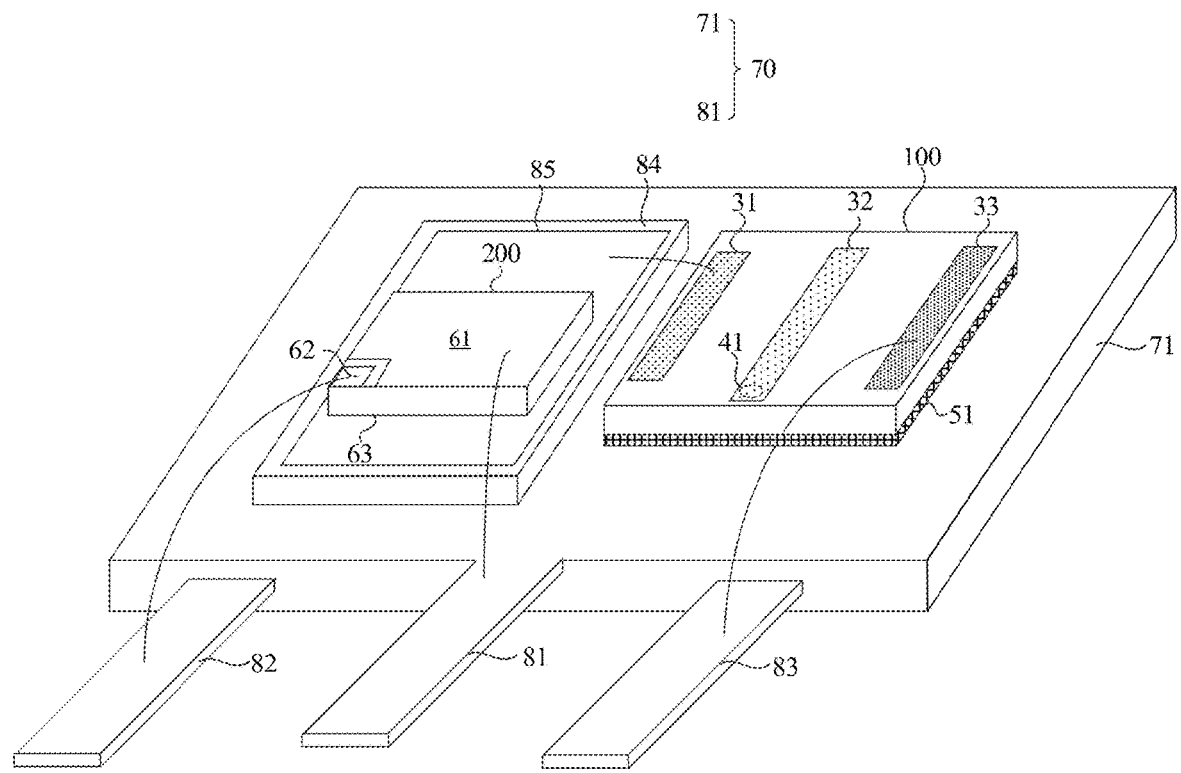
FIG. 8 is a schematic structural diagram of another semiconductor package structure provided by an embodiment of the present disclosure.

Based on the same inventive concept, an embodiment of the present disclosure also provides a semiconductor package structure, and the semiconductor package structure may adopt a Cascode structure, FIG. 6 is a schematic circuit diagram of a semiconductor package structure using a Cascode structure provided by an embodiment of the present disclosure, FIG. 7 is a schematic structural diagram of a semiconductor package structure provided by an embodiment of the present disclosure and FIG. 8 is a schematic structural diagram of another semiconductor package structure provided by an embodiment of the present disclosure. As shown in FIG. 6, FIG. 7, and FIG. 8, the semiconductor package structure provided by the embodiment of the present disclosure includes the semiconductor package structure 100 described in the foregoing embodiment, and further includes a switching transistor 200, and the switching transistor 200 includes a second source 61, a second gate 62, and a second drain 63, the first source 31 is electrically connected to the second drain 63, and the first gate 32 is electrically connected to the second source 61, the first drain 33 is connected to the drain signal, the first gate 32 and the second source 61 are connected to the source signal, and the second gate 62 is connected to the gate signal, the first source 31 is attached and electrically connected to the second drain 63, as shown in FIG. 7, or the semiconductor package structure further includes a connection structure 70, the first gate 32, and the second source 61 being respectively electrically connected to the connection structure 70, and the back surface gate contact electrode 51 electrically connected to the first gate 32 being attached to a surface of the connection structure 70, as shown in FIG. 8.

Exemplarily, the semiconductor package structure provided by the embodiment of the present disclosure may be a semiconductor package structure adopting a Cascode structure, including a semiconductor device 100 provided by an embodiment of the present disclosure and a switching transistor 200. The semiconductor device includes a first source 31, a first gate 32, and a first drain 33. The switching transistor 200 includes a second source 61, a second gate 62, and a second drain 63, the first source 31 being electrically connected to the second drain 63, and the first gate 32 being electrically connected to the second source 61, the first drain 33 is connected to the drain signal, the first gate 32, and the second source 61 are connected to the source signal, and the second gate 62 is connected to the gate signal. The switching transistor 200 may be a Si field effect transistor or a Si metal oxide field effect transistor, using the good switching performance of the switching transistor 200 and the good withstand voltage performance of the semiconductor device 100, to ensure that the semiconductor package device has good electrical characteristics.

As shown in FIG. 7, the switching transistor 200 is stacked with the semiconductor device 100, and the second drain 63 is directly stacked on the surface of the first source 31 to realize the electrical connection between the first source 31 and the second drain 63 instead of using wire bonding, to reduce the parasitic inductance and parasitic resistance, and improve the electrical performance of the semiconductor package structure. Or, as shown in FIG. 8, the back surface gate contact electrode 51 electrically connected to the first gate 32 is attached to the surface of the connection structure 70, and the first gate 32 is electrically connected to the surface of the connection structure 70 without wire bonding, which may reduce parasitic inductance and parasitic resistance, and improve the electrical performance of the semiconductor package structure.

Two semiconductor package structures will be described in detail below.

Referring to FIG. 8, the semiconductor device 100 includes a gate via structure 41 penetrating the substrate 10 and the multilayer semiconductor layer 20, and a back surface gate contact electrode 51 located on one side of the substrate 10 away from the multilayer semiconductor layer 20, the first gate 32 being electrically connected to the back surface gate contact electrode 51 through the gate via structure 41, the connection structure 70 includes a frame 71 and a source signal input terminal 81 located on the first surface of the frame 71, the back surface gate contact electrode 51 being attached and electrically connected to the source signal input terminal 81, and the second source 61 being electrically connected to the source signal input terminal 81 by wire bonding.

Exemplarily, the first gate 32 is electrically connected to the back surface gate contact electrode 51 through the gate via structure 41, so only the first gate 32 needs to be connected to the signal from the back surface in the semiconductor device 100, a source signal input terminal 81 arranged on the entire surface is formed on the first surface of the frame 71, and the back surface gate contact electrode 51 is directly attached and electrically connected to the source signal input terminal 81 arranged on the entire surface, the electrical connection between the first gate 32 and the source signal input terminal 81 does not require wire bonding, which can reduce parasitic inductance and parasitic resistance, and improve the electrical performance of the semiconductor package structure. At the same time, the second source 61 is electrically connected to the source signal input terminal 81 by wire bonding to ensure that the electrical connection between the first gate 32 and the second source 61 is achieved.

Referring to FIG. 8, the semiconductor package structure further includes a gate signal input terminal 82, a drain signal input terminal 83, and a supporting sheet 84, the supporting sheet 84 includes a second surface and a third surface that are oppositely arranged and insulated from each other, the third surface being attached to the first surface of the frame 71, and the second surface being provided with a surface connection layer 85, the second source 61 and the second drain 63 are located on opposite surfaces of the switching transistor 200, the first source 31 is electrically connected to the surface connection layer 85 by wire bonding, and the second drain 63 is attached to the surface connection layer 85, the first drain 33 is electrically connected to the drain signal input terminal 83 by wire bonding, and the second gate 62 is electrically connected to the gate signal input terminal 82 by wire bonding.

Exemplarily, the first source 31 is electrically connected to the surface connection layer 85 by wire bonding, and the second drain 63 is attached to the surface connection layer 85 to realize electrical connection between the first source 31 and the second drain 63. The first drain 33 is electrically connected to the drain signal input terminal 83 by wire bonding to load the drain signal, and the second gate 62 is electrically connected to the gate signal input terminal 82 by wire bonding to load the gate signal, the first gate 32 is electrically connected to the source signal input terminal 81 through the back surface gate contact electrode 51 that is electrically connected thereto and is attached to the source signal input terminal 81, and the second source 61 is electrically connected to the source signal input terminal 81 by wire bonding to realize the electrical connection between the first gate 32 and the second source 61 while loading the source signal, and thus achieving the signal input on the semiconductor package structure of the entire Cascode structure to ensure the normal operation of the semiconductor package structure.

Referring to FIG. 7, the semiconductor device 100 includes a gate via structure 41 and a drain via structure 42 penetrating the substrate 10 and the multilayer semiconductor layer 20, and a back surface gate contact electrode 51 and a drain back contact electrode 52 located on one side of the substrate 10 away from the multilayer semiconductor layer 20, the first gate 32 is electrically connected to the back surface gate contact electrode 51 through the gate via structure 41, and the first drain 33 is electrically connected to the drain back contact electrode 52 through the drain via structure 42, the second source 61 and the second drain 63 are located on the opposite surfaces of the switching transistor 200; 200, and the first source 31 the second drain 63 are attached and electrically connected.

Exemplarily, the first gate 32 is electrically connected to the back surface gate contact electrode 51 through the gate via structure 41, and the first drain 33 is electrically connected to the drain back contact electrode through the drain via structure 42, so only the first source 31 needs that the signal is input from the front surface in the semiconductor device 100, the switch transistor 200 is stacked with the semiconductor device 100, and the second drain 63 is directly stacked on the surface of the first source 31, so as to achieve the electrical connection between the first source 31 and the second drain 63, instead of using wire bonding, to reduce parasitic inductance and parasitic resistance and improve the electrical performance of the semiconductor package structure.

Referring to FIG. 7, the semiconductor package structure further includes a source signal input terminal 81, a gate signal input terminal 82, and a drain signal input terminal 83, the first gate 32 is electrically connected to the source signal input terminal 81 by wire bonding, and the second source 61 is electrically connected to the source signal input terminal 81 by wire bonding; the first drain 33 is electrically connected to the drain signal input terminal 83 by wire bonding, and the second gate 62 is electrically connected to the gate signal input terminal 82 by wire bonding.

Exemplarily, the first gate 32 is electrically connected to the source signal input terminal 81 by wire bonding, and the second source 61 is electrically connected to the source signal input terminal 81 by wire bonding, to ensure that the first gate 32 and the second source 61 are input with source signals, while achieving the electrical connection between the first gate 32 and the second source 61. The first drain 33 is electrically connected to the drain signal input terminal 83 by wire bonding to load the drain signal, and the second gate 62 is electrically connected to the gate signal input terminal 82 by wire bonding to load the gate signal, thereby achieving the signal input on the semiconductor package structure of the entire Cascode structure, to ensure the normal operation of the semiconductor package structure.

Figure 9:
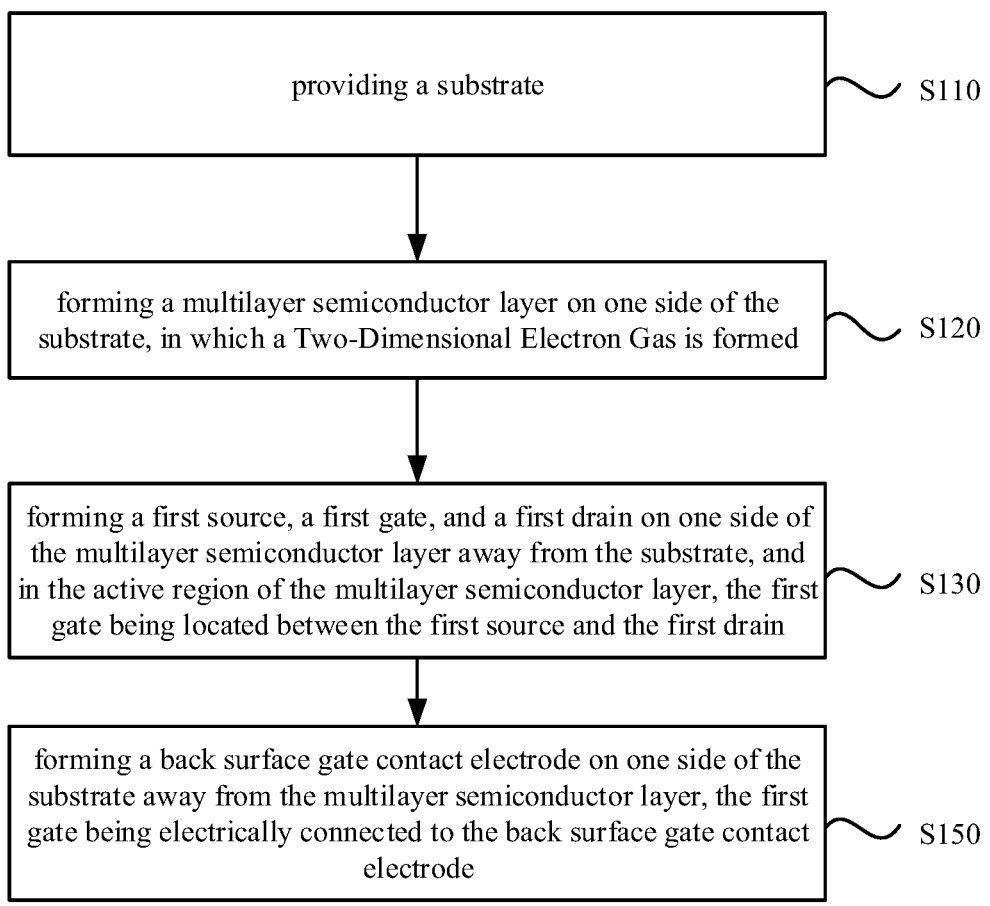
FIG. 9 is a schematic flowchart of a method of manufacturing a semiconductor device according to an embodiment of the present disclosure.

Based on the same inventive concept, an embodiment of the present disclosure also provides a method of manufacturing a semiconductor device. FIG. 9 is a schematic flowchart of a method of manufacturing a semiconductor device according to an embodiment of the present disclosure. As shown in FIG. 9, the method of manufacturing a semiconductor device according to the embodiment of the present disclosure comprises:

S110: providing a substrate.

Exemplarily, the material of the substrate may be one or a combination of sapphire, silicon carbide, silicon, gallium arsenide, gallium nitride, or aluminum nitride, and it may also be other materials suitable for growing gallium nitride. The method of manufacturing the substrate may be atmospheric pressure chemical vapor deposition method, sub-atmospheric pressure chemical vapor deposition method, metal organic compound vapor deposition method, low pressure chemical vapor deposition method, high-density plasma chemical vapor deposition method, ultra-high vacuum chemical vapor deposition method, plasma enhanced chemical vapor deposition method, catalyst chemical vapor deposition method, hybrid physical chemical vapor deposition method, rapid thermal chemical vapor deposition method, vapor phase epitaxy method, pulsed laser deposition method, atomic layer epitaxy method, molecular beam epitaxy method, sputtering method or evaporation method.

S120: forming a multilayer semiconductor layer on one side of the substrate, in which a Two-Dimensional Electron Gas is formed.

Forming a multilayer semiconductor layer on one side of the substrate, in which a Two-Dimensional Electron Gas is formed, may include forming a nucleation layer on one side of the substrate, forming a buffer layer on one side of the nucleation layer away from the substrate, forming a channel layer on one side of the buffer layer away from the nucleation layer, forming a barrier layer on one side of the channel layer away from the buffer layer, the barrier layer and the channel layer forming a heterojunction structure, and a Two-Dimensional Electron Gas being formed at the interface of the heterojunction.

S130: forming a first source, a first gate, and a first drain on one side of the multilayer semiconductor layer away from the substrate, and in the active region of the multilayer semiconductor layer, the first gate being located between the first source and the first drain.

The first source and the first drain form an ohmic contact with the multilayer semiconductor layer, and the first gate electrode forms a Schottky contact with the multilayer semiconductor layer. The first source, the first gate and the first drain may be formed by processes such as photolithography, deposition or etching, it is also possible to form the first gate after removing the Two-Dimensional Electron Gas corresponding to the passive region through an ion implantation process or an oxidation isolation process, after the formation of the first source and the first drain, and the embodiment of the present disclosure does not limit how to form the first source, the first gate, and the first drain.

S150: forming a back surface gate contact electrode on one side of the substrate away from the multilayer semiconductor layer, the first gate being electrically connected to the back surface gate contact electrode.

Prior to step S150, step S140 may be performed forming a gate via structure penetrating the substrate and the multilayer semiconductor layer, so that the first gate is electrically connected to the back surface gate contact electrode through the gate via structure.

Exemplarily, the gate via structure that penetrates the substrate and the multilayer semiconductor layer may be formed by an etching method, and the embodiment of the present disclosure does not limit how to form the gate via structure.

Exemplarily, after the gate via structure is formed, a back surface gate contact electrode is formed on one side of the substrate away from the multilayer semiconductor layer, and the first gate is electrically connected to the back surface gate contact electrode through the gate via structure, thereby ensuring that signals may be provided to the first gate from the back surface of the semiconductor device, and ensuring that the first source, the first gate, and the first drain of the semiconductor device may be loaded with signals from different surfaces. This may reduce the interconnection wires used in the semiconductor packaging process, reduce the parasitic inductance and parasitic resistance caused by the wire interconnection, and improve the performance and stability of the semiconductor device under high-frequency switching, meanwhile, it can also avoid the restriction of the wire layout due to loading signals to the first source, the first gate and the first drain from the same surface during the packaging process of the semiconductor device, thereby improving the packaging flexibility of the semiconductor device.

The method of manufacturing a semiconductor device provided by the embodiment of the present disclosure may further include forming a drain back contact electrode on one side of the substrate away from the multilayer semiconductor layer, the first drain being electrically connected to the drain back contact electrode.

Prior to forming the drain back contact electrode, a drain via structure that penetrates the substrate and the multilayer semiconductor layer may also be formed, so that the first drain is electrically connected to the drain back contact electrode through the drain via structure.

Exemplarily, the drain via structure and the gate via structure may be formed in the same process at the same time, so as to ensure a simple manufacturing process of the semiconductor device; meanwhile, the drain back contact electrode and the back surface gate contact electrode may be formed in the same process at the same time, so as to ensure a simple manufacturing process of the semiconductor device.

A gate via structure and a drain via structure that penetrate the substrate and the multilayer semiconductor layer are formed, and a back surface gate contact electrode and a drain back contact electrode are formed on one side of the substrate away from the multilayer semiconductor layer, the first gate being electrically connected to the back surface gate contact electrode through the gate via structure, and the first drain being electrically connected to the drain back contact electrode through the drain via structure. In this way, signals may be loaded from the back surface of the semiconductor device to the back surface gate contact electrode and the drain back contact electrode, respectively, and then are transmitted to the first gate and the first drain through the gate via structure and the drain via structure, respectively, which ensures that the first source, the first gate and the first drain of the semiconductor device may loaded with signals from different surfaces. This may reduce the interconnection wires used in the semiconductor packaging process, reduce the parasitic inductance and parasitic resistance caused by the wire interconnection, and improve the performance and stability of the semiconductor device under high-frequency switching, meanwhile, it can also avoid the restriction of the wire layout due to loading signals to the first source, the first gate and the first drain from the same surface during the packaging process of the semiconductor device, thereby improving the packaging flexibility of the semiconductor device, this may not only greatly increase the dynamic resistance of the device, but also take into account the heat dissipation around the working center of the device at the same time and improve the reliability and service life of the semiconductor device.

Note that the above are only example embodiments of the present disclosure and the applied technical principles. Those skilled in the art will appreciate that the present disclosure is not limited to the specific embodiments described herein, and the features of the various embodiments of the present disclosure may be partially or fully coupled or combined with each other, and may cooperate with each other in various ways and be technically driven. Those skilled in the art can make various obvious changes, readjustments, mutual combinations and substitutions without departing from the protection scope of the present disclosure. Therefore, although the present disclosure has been described in detail through the embodiments above, the present disclosure is not limited to the embodiments above. Without departing from the concept of the present disclosure, the present disclosure may also include more other equivalent embodiments, and the scope of the present disclosure is determined by the scope of the appended claims.

What is claimed is:

1. A semiconductor device comprising:
   a substrate;
   a multilayer semiconductor layer located on one side of the substrate, in which a Two-Dimensional Electron Gas is formed;
   a first source, a first gate, and a first drain located on one side of the multilayer semiconductor layer away from the substrate and located within an active region of the multilayer semiconductor layer, the first gate located between the first source and the first drain; and
   a back surface gate contact electrode located on one side of the substrate away from the multilayer semiconductor layer;
   wherein the back surface gate contact electrode is electrically connected to the first gate; and
   wherein the semiconductor device further comprises a drain via structure penetrating the substrate and the multilayer semiconductor layer, and a drain back contact electrode located on one side of the substrate away from the multilayer semiconductor layer, and wherein the first drain is electrically connected to the drain back contact electrode through the drain via structure.

2. The semiconductor device according to claim 1, wherein a vertical projection of the back surface gate contact electrode on the substrate covers at least a part of a vertical projection of the first gate on the substrate.

3. The semiconductor device according to claim 2, wherein a projection area of the back surface gate contact electrode on the substrate is greater than a sum of vertical projection areas of the first source, the first gate, and the first drain within the active region on the substrate.

4. The semiconductor device according to claim 1, wherein the semiconductor device further comprises a gate via structure penetrating the substrate and the multilayer semiconductor layer, and wherein the first gate is electrically connected to the back surface gate contact electrode through the gate via structure.

5. The semiconductor device according to claim 4, wherein the semiconductor device further comprises a gate contact electrode, and wherein the first gate extends to a passive region of the multilayer semiconductor layer to form the gate contact electrode; and
   a vertical projection of the gate contact electrode on the substrate covers a vertical projection of the gate via structure on the substrate, and the first gate is electrically connected to the back surface gate contact electrode through the gate contact electrode and the gate via structure.

6. The semiconductor device according to claim 1, wherein the semiconductor device further comprises a drain contact electrode, and the first drain extends to a passive region of the multilayer semiconductor layer to form the drain contact electrode; and
   a vertical projection of the drain contact electrode on the substrate covers a vertical projection of the drain via structure on the substrate, and the first drain is electrically connected to the drain back contact electrode through the drain contact electrode and the drain via structure.

7. The semiconductor device according to claim 1, wherein the back surface gate contact electrode and the drain back contact electrode are provided in the same layer and insulated.

8. A semiconductor package structure comprising a semiconductor device according to claim 1;
   further comprising a switching transistor, wherein the switching transistor comprises a second source, a second gate, and a second drain;
   wherein the first source is electrically connected to the second drain, wherein the first gate is electrically connected to the second source, wherein the first drain is input with a drain signal, wherein the first gate and the second source are input with a source signal, and wherein the second gate is input with a gate signal; and
   the first source and the second drain are attached and electrically connected; or
   the semiconductor package structure further comprises a connection structure, wherein the first gate and the second source are respectively electrically connected to the connection structure, and wherein the back surface gate contact electrode electrically connected to the first gate is attached to a surface of the connection structure.

9. The semiconductor package structure according to claim 8, wherein the semiconductor device comprises a gate via structure penetrating the substrate and the multilayer semiconductor layer, and wherein the first gate is electrically connected to the back surface gate contact electrode through the gate via structure;
   the connection structure comprises a frame and a source signal input terminal located on a first surface of the frame, wherein the back surface gate contact electrode is attached and electrically connected to the source signal input terminal, and wherein the second source is electrically connected to the source signal input terminal by wire bonding.

10. The semiconductor package structure according to claim 9, wherein the semiconductor package structure further comprises a gate signal input terminal, a drain signal input terminal, and a supporting sheet, wherein the supporting sheet comprises a second surface and a third surface that are oppositely arranged and insulated from each other, wherein the third surface is attached to the first surface, and wherein the second surface being provided with a surface connection layer;

the second source and the second drain are located on opposite surfaces of the switching transistor; and the first source is electrically connected to the surface connection layer by wire bonding, wherein the second drain is attached to the surface connection layer, wherein the first drain is electrically connected to the drain signal input terminal by wire bonding, and wherein the second gate is electrically connected to the gate signal input terminal by wire bonding.

11. The semiconductor package structure according to claim 8, wherein the semiconductor device comprises a gate via structure and a drain via structure penetrating the substrate and the multilayer semiconductor layer, wherein a drain back contact electrode is located on one side of the substrate away from the multilayer semiconductor layer, wherein the first gate is electrically connected to the back surface gate contact electrode through the gate via structure, and wherein the first drain is electrically connected to the drain back contact electrode through the drain via structure;

the second source and the second drain are located on opposite surfaces of the switching transistor; and the first source is attached and electrically connected to the second drain.

12. The semiconductor package structure according to claim 11, wherein the semiconductor package structure further comprises a source signal input terminal, a gate signal input terminal, and a drain signal input terminal;

the first gate is electrically connected to the source signal input terminal by wire bonding, and the second source is electrically connected to the source signal input terminal by wire bonding, wherein the first drain is electrically connected to the drain signal input terminal by wire bonding, and the second gate is electrically connected to the gate signal input terminal by wire bonding.

13. A method of manufacturing a semiconductor device, the method comprising:

providing a substrate;

forming a multilayer semiconductor layer on one side of the substrate, in which a Two-Dimensional Electron Gas is formed;

forming a first source, a first gate, and a first drain on one side of the multilayer semiconductor layer away from the substrate and within an active region of the multilayer semiconductor layer, the first gate located between the first source and the first drain;

forming a back surface gate contact electrode on one side of the substrate away from the multilayer semiconductor layer, the first gate electrically connected to the back surface gate contact electrode; and forming a drain back contact electrode on one side of the substrate away from the multilayer semiconductor layer, the first drain electrically connected to the drain back contact electrode.

14. The method of manufacturing a semiconductor device according to claim 13, wherein the method of manufacturing further comprises:

forming a gate via structure penetrating the substrate and the multilayer semiconductor layer;

wherein the first gate is electrically connected to the back surface gate contact electrode through the gate via structure.

15. The method of manufacturing a semiconductor device according to claim 13, wherein the method of manufacturing further comprises:

forming a drain via structure penetrating the substrate and the multilayer semiconductor layer;

wherein the first drain is electrically connected to the drain back contact electrode through the drain via structure.

\* \* \* \* \*